(12) United States Patent
Sturtevant et al.

(10) Patent No.: US 6,913,872 B1
(45) Date of Patent: Jul. 5, 2005

(54) DUAL-WAVELENGTH EXPOSURE FOR REDUCTION OF IMPLANT SHADOWING

(75) Inventors: John L. Sturtevant, Beaverton, OR (US); Yiming Gu, Hillsboro, OR (US); Dyiann Chou, Portland, OR (US); Chantha Lom, Beaverton, OR (US)

(73) Assignee: Integrated Device Technology, Inc., Santa Clara, CA (US)

( * ) Notice: Subject to any disclaimer, the term of this patent is extended or adjusted under 35 U.S.C. 154(b) by 185 days.

(21) Appl. No.: 10/262,301

(22) Filed: Sep. 30, 2002

(51) Int. Cl.[7] .................................................. G03F 7/20
(52) U.S. Cl. .......................... 430/322; 430/394; 430/494
(58) Field of Search ................................ 430/311, 322, 430/327, 328, 394, 494

(56) References Cited

U.S. PATENT DOCUMENTS

| | | |
|---|---|---|
| 5,480,047 A | 1/1996 | Tangawa et al. ............. 438/381 |
| 5,700,731 A | 12/1997 | Lin et al. ....................... 216/12 |
| 6,168,904 B1 | 1/2001 | Cuthbert et al. ............. 430/312 |
| 6,416,938 B1 | 7/2002 | Kubacki ...................... 430/323 |
| 6,432,790 B1 | 8/2002 | Okamoto et al. ........... 438/377 |
| 6,576,405 B1 * | 6/2003 | Buffat et al. ................ 430/322 |
| 6,740,475 B2 * | 5/2004 | Richter et al. .............. 430/322 |

* cited by examiner

*Primary Examiner*—Kathleen Duda
(74) *Attorney, Agent, or Firm*—Kenneth Glass; Glass & Associates

(57) ABSTRACT

A method for generating a photoresist structure is disclosed in which a layer of photoresist is deposited over a semiconductor substrate. In a first exposure, the layer of photoresist is exposed to deep ultraviolet light. A second exposure is then performed using a different wavelength of light to pattern the layer of photoresist. The photoresist is then developed so as to form a photoresist structure having reduced thickness and rounded corners. This gives a photoresist structure having a reduced shadow area. An angled ion implant can then be performed using the photoresist structure as a mask.

14 Claims, 7 Drawing Sheets

DUAL-WAVELENGTH EXPOSURE FOR REDUCTION OF IMPLANT SHADOWING

FIELD OF THE INVENTION

The present invention relates to the field of semiconductor devices. More specifically, the present invention relates to forming photoresist structures that can be used for ion implantation.

BACKGROUND ART

Ion implantation is one of the key technologies in the fabrication of semiconductor integrated circuit devices. With current ion implanters, a very accurate and extremely pure dose of a desired atomic species can be introduced into a target material. Photoresist is typically used as a masking structure for controlling where implants are to be located. More particularly, a layer of photoresist is deposited, exposed through a photo mask and developed to produce a photoresist structure having openings at locations where implants are to be located.

One type of ion implant, commonly referred to as an "angled implant" involves implantation of species at an angle that is not orthogonal to the top surface of the semiconductor substrate. Angled implants are often used in semiconductor fabrication processes to minimize the channeling effect in order to place dopants at appropriate positions within the semiconductor substrate. However, the photoresist masking structure produces an implant "shadow" in angled implants. That is, the photoresist structure obstructs implantation within an area commonly referred to as a shadow area. Shadow area limits reduction in size of semiconductor devices and limits flexibility of the device design process.

The location and size of the shadow area depends on the direction of the implant, the implant angle, the height of the photoresist structure, and the photoresist profile. Shadow area could be reduced by depositing a layer of photoresist having the minimum thickness required for each particular ion implantation process. However, because of resist management practices that limit the use of resists having different viscosities and equipment capacity limitations that do not allow for precise control of the thickness of the photoresist layer, the layer of photoresist is often much thicker than the basic blockage requirement for a particular implantation process.

Accordingly, there is a need for a method for reducing shadow area. Also, there is a need for a method for forming a photoresist structure that reduces shadow area. In addition, there is a need for a method for forming an implant region in which shadow area is reduced. The present invention meets the above needs.

DISCLOSURE OF THE INVENTION

The present invention provides a method for forming a photoresist structure and a method for forming an implant region in which shadow area is reduced. The reduction in shadow area provided by the present invention allows for further reduction in device size and gives greater design flexibility.

A method for forming a photoresist structure is disclosed in which dual wavelengths are used. First, a layer of photoresist is formed over a semiconductor substrate. The layer of photoresist is then exposed to light having a first wavelength. The first wavelength is a wavelength for which the layer of photoresist has high optical absorption. Because the layer of photoresist has high optical absorption of the first wavelength of light, the light will be absorbed near the top surface of the layer of photoresist.

A second exposure is then performed to pattern the photoresist. This second exposure uses a different wavelength of light from the first exposure and selectively exposes portions of the layer of photoresist to light so as to form a desired pattern. In the present embodiment, the second exposure uses the designated wavelength for the layer of photoresist. The photoresist is then developed, producing a photoresist structure has reduced thickness and rounded corners.

In one embodiment, a photoresist structure is formed having an opening. Ions are implanted at an angle that is not orthogonal to the top surface of the semiconductor substrate. These ions pass through the opening and penetrate the substrate surface, eventually coming to rest in the designated target area so as to form an implant region.

Because the thickness of the photoresist structure is reduced, the shadow area is reduced. The shadow area is further reduced as a result of the rounding of the corners of the photoresist structure. Thereby, semiconductor device size reductions are possible and device layout flexibility is increased.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
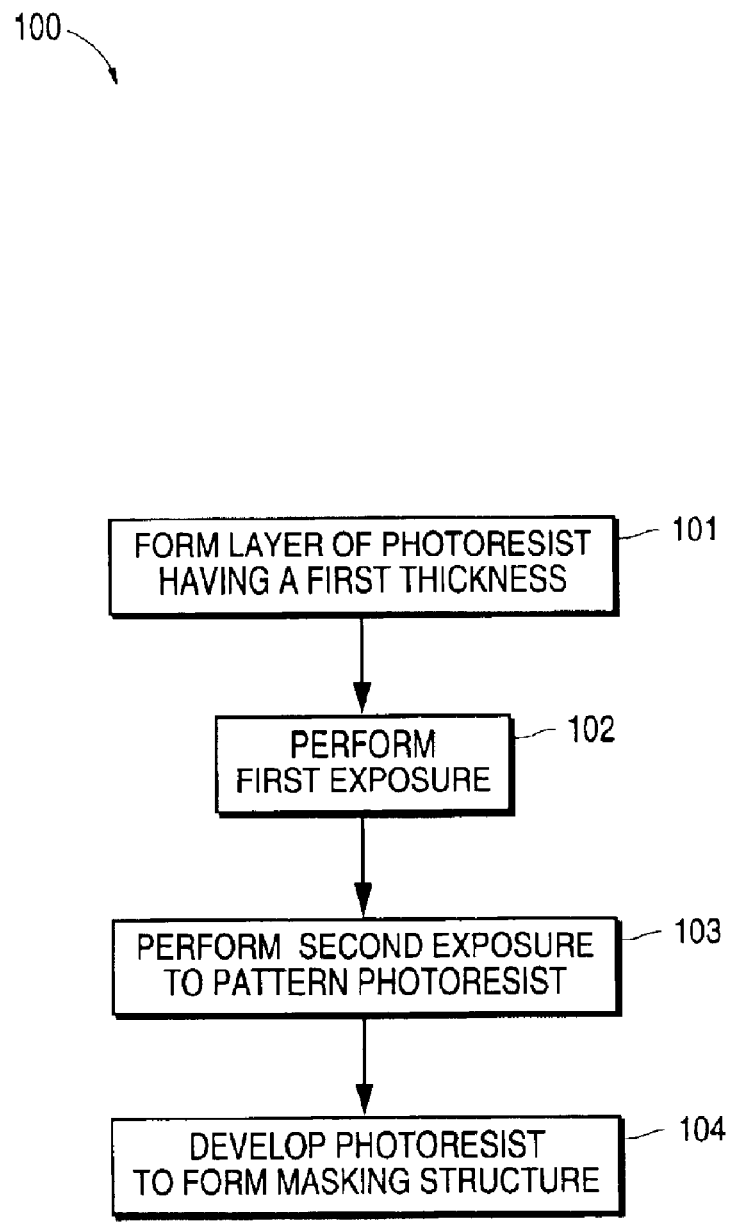
FIG. 1 is a flow chart that illustrates a method for forming a photoresist structure in accordance with one embodiment of the present invention.

FIG. 1 illustrates a method 100 for forming a photoresist structure having a reduced implant shadow area. First, as shown by step 101, a layer of photoresist is formed over a semiconductor substrate. In one embodiment, the layer of photoresist is formed by placing a semiconductor substrate in a photoresist coating unit and flowing photoresist into the coating unit such that the photoresist is deposited onto the semiconductor substrate. The wafer is then heated in a conventional soft-bake process step to remove excess solvent.

In one embodiment, the layer of photoresist comprises photoresist having high absorption of deep ultraviolet light. More particularly, the layer of photoresist comprises photoresist having a high absorption coefficient for deep ultraviolet light. In one embodiment, the photoresist has a sufficiently high absorption of deep ultraviolet light that deep ultraviolet light will be completely absorbed by the top portion of the layer of photoresist near the top surface of the layer of photoresist. More particularly, the photoresist has a sufficiently high absorption coefficient for deep ultraviolet light that deep ultraviolet light will be completely absorbed by the top portion of the photoresist layer of photoresist near the top surface of the layer of photoresist.

In one embodiment the layer of photoresist is i-line photoresist. The term "i-Line photoresist" as used in the present application includes resist materials that are designed for use with light having a wavelength of 365 nanometers and materials that are designed for use with 365 nanometer wavelength scanners and steppers and includes photoresists that are adapted generally for 365 nanometer development processes. In one embodiment the i-line photoresist is a polymer resist that includes Novolak resin. In one specific embodiment JSR IX875 photoresist, made by JSR Microelectronics of Sunnyvale, Calif. is used. However, it is appreciated that any of a number of different i-line photoresists could be used.

Figure 2:
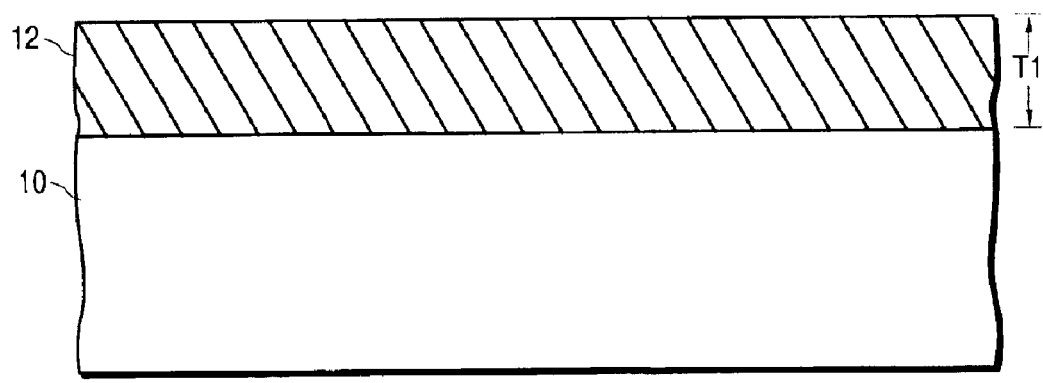
FIG. 2 shows a cross-sectional view that illustrates a photoresist layer that has a thickness T1, and that is formed over a semiconductor substrate in accordance with one embodiment of the present invention.

FIG. 2 illustrates a layer of photoresist 12 that is formed over a semiconductor substrate 10 in accordance with step 101 of the present invention. Layer of photoresist 12 is shown to have a thickness T1. In FIG. 2, semiconductor substrate 10 is shown as a blank semiconductor wafer. However, it is appreciated that other structures and/or implant regions could be formed in or on the semiconductor substrate prior to depositing layer of photoresist 12.

A first exposure is performed as is illustrated by step 102 so as to expose the layer of photoresist to a first wavelength of light. In the present embodiment, exposure step 102 is a complete and unobstructed exposure. More particularly, exposure step 102 is not a patterning exposure and no photo mask or other device is used that could create a pattern. Instead, the entire top surface of the layer of photoresist deposited in step 101 is blanketed by light.

In one embodiment, exposure step 102 is performed by placing the semiconductor substrate in a deep ultraviolet optical scanner that has an open reticle. The entire surface of the semiconductor substrate is then exposed, field by field. Thereby, the entire surface of the photoresist layer deposited in step 101 is exposed to light.

Referring to FIG. 2, in one embodiment, the entire top surface of layer of photoresist 12 is exposed region by region. However, alternatively, a single exposure could be used to expose the entire top surface of layer of photoresist 12.

In one alternate embodiment, step 102 only exposes certain fields to deep ultraviolet light. Thereby, fields that are not used as a masking structure do not have to be blanketed, saving time. In one embodiment, only those fields in which an implantation is to be performed are blanketed with light in step 102.

In the present embodiment, the first wavelength of light has a wavelength that will be completely absorbed by the top portion of the layer of photoresist. More particularly, the photoresist used in step 101 will have a sufficiently high absorption coefficient for the wavelength of light used in step 102 such that the light used in step 102 will be completely absorbed by the top portion of the layer of photoresist near the top surface of the layer of photoresist.

In one embodiment, the first exposure exposes the layer of photoresist deposited in step 101 to light having a wavelength in the deep ultraviolet range, also known as "deep ultraviolet light." Deep ultraviolet wavelengths that can be used include 248 nanometers, 193 nanometers and 157 nanometers.

When the deep ultraviolet light strikes the top surface of layer of photoresist 12 it will be absorbed near the top of layer of photoresist 12. The region near the top surface in which the light is absorbed then changes from insoluble to soluble (when a positive working photoresist is used).

Continuing with step 102, in one embodiment, a light source is used that produces light having a wavelength of approximately 248 nanometers. In one embodiment a 248 nanometer optical scanner or a 248 nanometer stepper is used.

Continuing with step 102, in another embodiment, a light source is used that produces light having a wavelength of approximately 193 nanometers. In one embodiment a 193 nanometer optical scanner or a 193 nanometer stepper is used.

In yet another embodiment, a light source is used in step 102 that produces light having a wavelength of approximately 157 nanometers. In one embodiment a 157 nanometer optical scanner or a 157 nanometer stepper is used.

A second exposure is performed as is shown by step 103. In the present embodiment exposure step 103 is performed immediately after the first exposure (step 102). The second exposure is a patterning exposure. More particularly, exposure 103 forms a pattern of light that penetrates the layer of photoresist deposited in step 101.

In one embodiment, exposure step 103 is performed by aligning a photo mask over the semiconductor substrate and exposing portions of the photoresist layer to light having a different wavelength from the light used in the first exposure.

In the present embodiment, the wavelength of light used in step 103 is a wavelength that is a designated wavelength for the type of photoresist deposited in step 101. The term "designated wavelength" as used in the present application includes those wavelengths of light that can be used to pattern a particular type of photoresist and includes any wavelength specified by a manufacturer of a particular type of photoresist to be used for patterning that type of photoresist. For example, i-line photoresists have a designated wavelength of 365 nanometers.

In one embodiment in which the photoresist deposited in step 101 is i-line photoresist, ultraviolet light is used in step 102, and light having a wavelength of approximately 365 nanometers is used in step 103. In one embodiment, an i-line scanner (e.g., an ASML i-line scanner) or an i-line stepper (e.g., an ASML i-line stepper) is used for performing the patterning exposure of step 103.

As shown by step 104, the photoresist is developed. In the present embodiment, the photoresist is developed using a wet development process that removes those portions of the photoresist layer that are soluble in the developer compound. However, alternatively, a dry development process is used.

Exposure step 102 photo-chemically changes the photoresist at the surface of the photoresist layer from a non-soluble polymer into a soluble polymer. Accordingly, the photoresist structure obtained as a result of steps 101–104 of FIG. 1 has reduced thickness. The combination of exposure step 102 and exposure step 103 results in the photoresist near the juncture of the penetration of the first exposure and the edge of the pattern of the second exposure being changed from insoluble to soluble. Accordingly, the photoresist structure obtained as a result of steps 101–104 of FIG. 1 has rounded corners.

Figure 3:
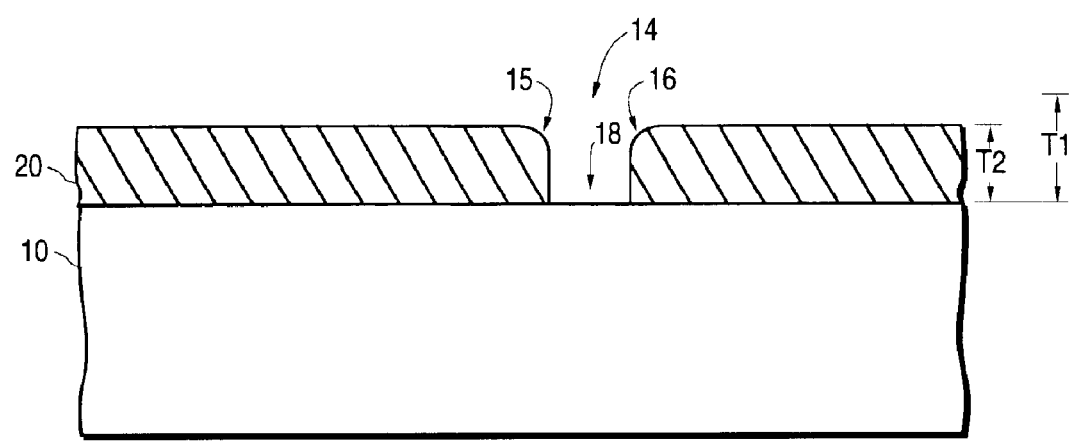
FIG. 3 is a cross-sectional view of the structure shown in FIG. 2 after a first exposure has been performed using a first wavelength of light, after a second exposure has been performed using a second wavelength of light, and after a development step has been performed in accordance with one embodiment of the present invention.

In the embodiment shown in FIG. 3 photoresist structure 20 is shown that is formed in accordance with steps 101–104 of FIG. 1. Photoresist structure 20 has a thickness T2 which is a reduced thickness compared with thickness T1 shown in FIG. 2. Also, corners 15–16 of opening 14 are rounded. Opening 14 extends completely through photoresist structure 20 so as to expose a portion 18 of semiconductor substrate 10.

Figure 4:
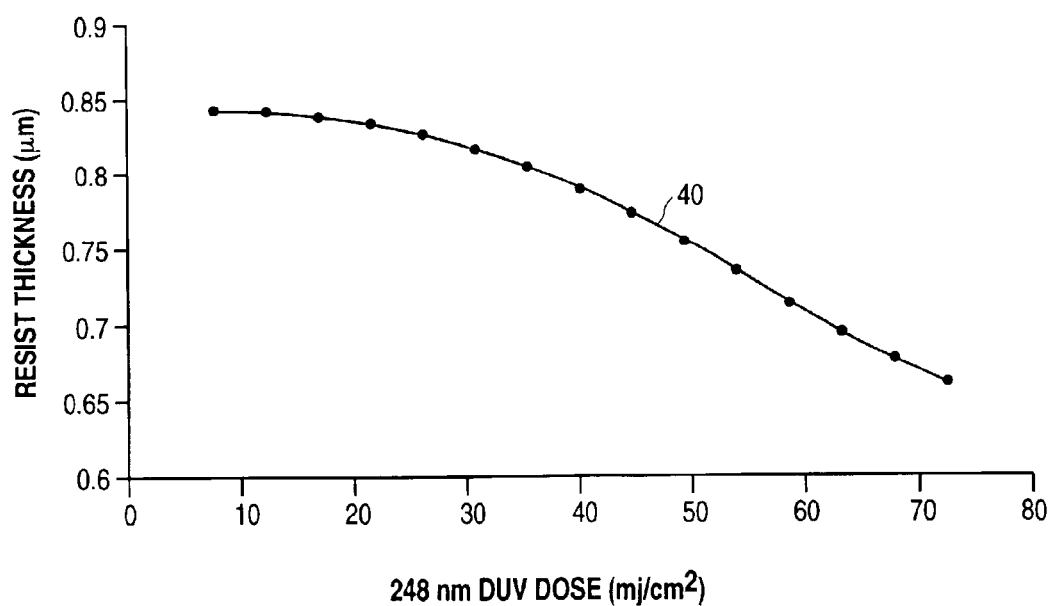
FIG. 4 is a diagram illustrating thickness of photoresist versus dosage in a first exposure using light having a wavelength of approximately 248 nanometers in accordance with one embodiment of the present invention.

FIG. 4 illustrates a curve 40 that shows exemplary resist thickness reduction for various doses of light for a resist having high optical absorption of the wavelength of light used. In the present example, curve 40 represents resist thickness reduction of JSR IX875 photoresist for various doses of ultraviolet light having a wavelength of 248 nanometers. It can be seen that the curve 40 that is obtained is smooth. Accordingly, the reduction in resist thickness can be easily controlled by adjusting the light dosage.

In the present embodiment, the light dosage that is used in step 102 of FIG. 1 is tailored to achieve the thinnest possible layer of photoresist that will provide the required ion blockage. More particularly, in one embodiment, the amount of thickness reduction that is required in order to achieve blockage of ions by the photoresist layer is calculated. The corresponding dosage is determined that will yield the desired reduction in thickness. For example, when the photoresist is JSR IX875 photoresist, graph 40 can be used to determine the light dosage to be used in step 102 to achieve the desired reduction in photoresist thickness.

In one embodiment, an ASML KrF deep ultraviolet scanner is used for performing step 102. It has been found that the use of this type of scanner produces almost a unique wavelength of approximately 248 nanometers. This has been found to produce a photoresist structure having good uniformity. For example, in an embodiment in which 40 millijoules of 248 nanometer light is used in step 101 and in which 150 millijoules of light is used in step 102 to form 0.57 micrometer dense line, a critical dimension variation (3σ) of only 12 nanometers is obtained across a wafer.

Figure 5:
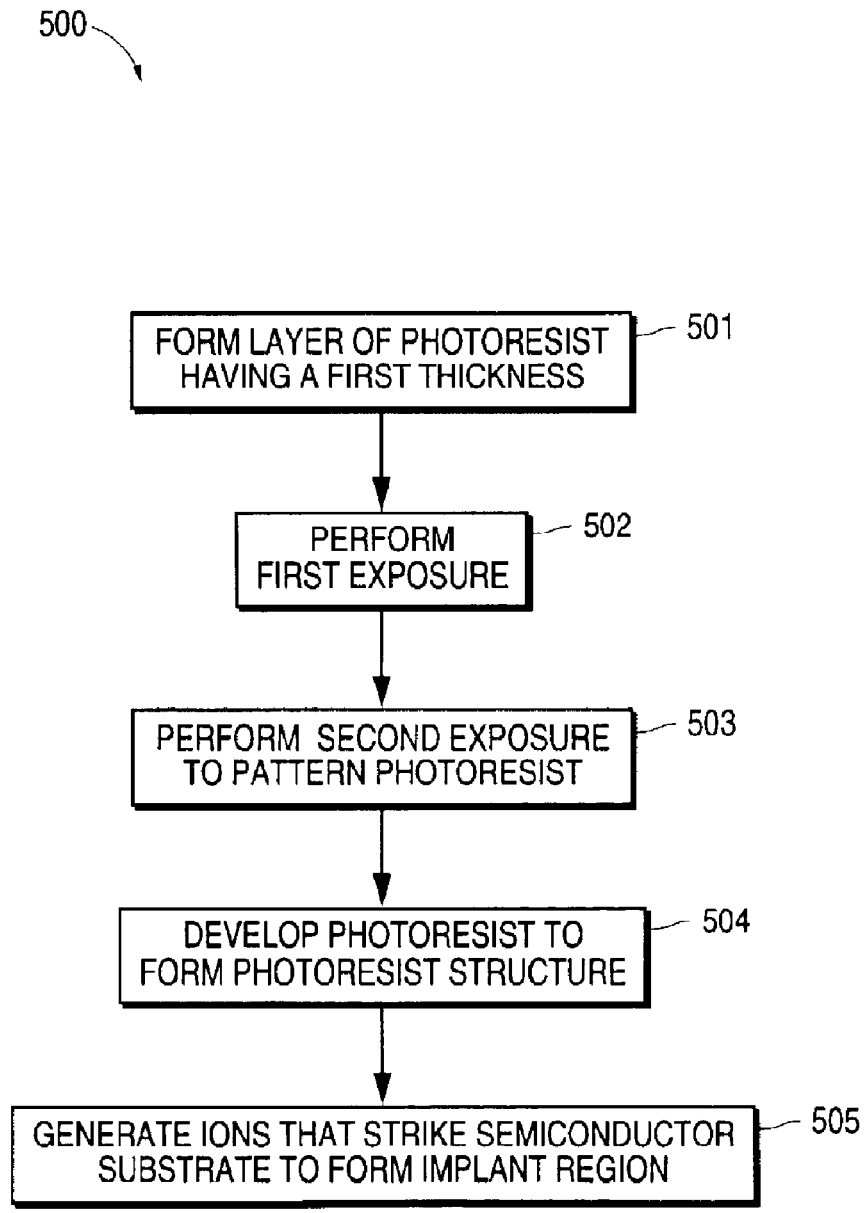
FIG. 5 is a flow chart that illustrates a method for forming an implant region in accordance with one embodiment of the present invention.

FIG. 5 illustrates a method 500 for forming an implant region. First as shown by steps 501–504 a photoresist structure is formed that has rounded corners and that has a reduced thickness. More particularly, a layer of photoresist is formed as is shown in step 501. A first exposure step is performed as shown by step 502. As shown by step 503, a second exposure step is performed to pattern the photoresist layer. A development step then removes portions of the layer of photoresist as shown by step 504, leaving a photoresist structure having an opening that extends therethrough. The resulting photoresist structure has reduced thickness and rounded corners. In one embodiment, steps 501–504 are performed in the same manner as steps 101–104 of FIG. 1.

Ion implantation is performed as is illustrated by step 505. In the present embodiment, the ion implantation is performed using an ion generator that is located such that it implants ions at an angle that is not orthogonal to the top surface of the semiconductor substrate.

Figure 6:
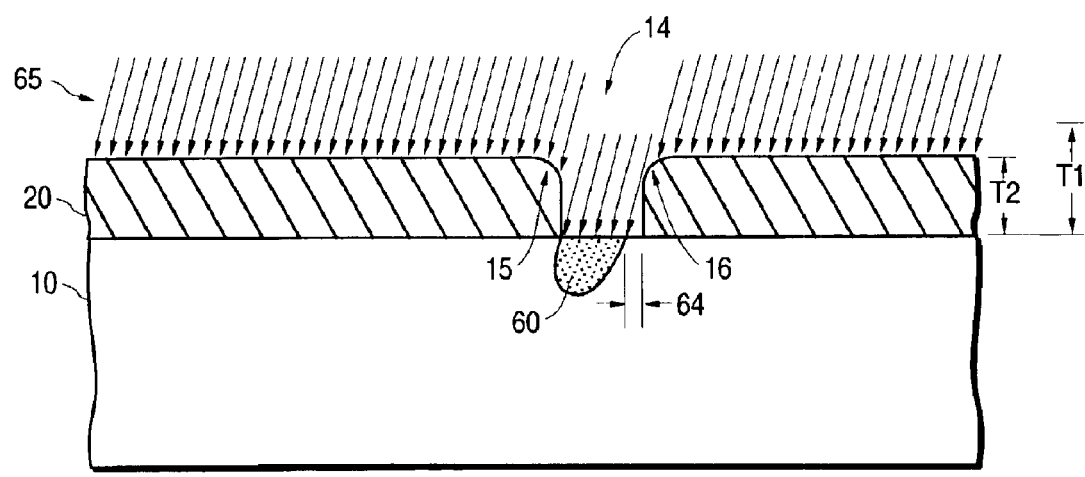
FIG. 6 is a cross-sectional view of the structure of FIG. 3 that illustrates an implant that is performed at an angle of 15 degrees in accordance with one embodiment of the present invention.

FIG. 6 illustrates an exemplary implant performed at an angle of 15 degrees. More particularly, semiconductor substrate 10 is located with respect to the ion implanter such that ions emitted by the ion implanter, illustrated by arrows 65, travel at an angle of fifteen degrees less than perpendicular. The ions that strike photoresist structure 20 are absorbed by photoresist structure 20. However, the ions 65 that pass through opening 14 strike substrate 10, forming implant region 60. It can seen that there is a shadow region 64 that lies within the exposed portion 18 of substrate 10 but which does not receive ions 65.

Continuing with FIG. 6, the reduction in thickness from thickness T1 to thickness T2 forms a shadow region 64 that is smaller than the shadow region that would be obtained in a prior art masking structure having thickness T1. More particularly, some of ions 65 that would be blocked by the greater thickness T1 are allowed to pass through opening 14. Accordingly, a larger implant region 60 and a smaller shadow region 64 are obtained as compared with a prior art masking structure having a thickness T1.

The rounding of corners 15–16 also results in reduced shadow area 64. More particularly, some of ions 65 that would be blocked by a fully angled corner are allowed to pass through opening 14. Accordingly, a larger implant region 60 and a smaller shadow region 64 are obtained as compared with a prior art masking structure not having rounded corners.

Any of a number of different types of ions could be implanted in step 505. In one embodiment, boron ions are implanted. In another embodiment germanium ions are implanted. However, it is appreciated that any desired type of ion could be implanted using method 500 of the present invention.

In one embodiment, step 505 includes a low energy ion implantation at an angle of 5 degrees for forming a shallow source-drain junction. In one embodiment, an additional low energy implant is performed at an angle of 7 degrees with four quadrants. That is, four implants are performed at an angle of 7 degrees; with the semiconductor substrate rotated 90 degrees between each implantation.

In another embodiment, the implant of step 505 is a large angle implantation. That is, the implant is performed at an angle of 45 degrees or more. In one specific embodiment, step 505 is a large-angle halo source-drain implant that is performed to increase Complementary Metal Oxide Semiconductor (CMOS) speed. In another embodiment, a large angle source-drain implant is performed on a high voltage Double-diffused Metal Oxide Semiconductor field effect transistor (DMOS) for obtaining a good compromise between lateral junction depth and vertical junction depth. In yet another embodiment, ion implant step 505 is a 45 degree germanium implantation at pre amorphization for increasing source-drain breakdown voltage in a Silicon-On-Insulator (SOI) MOSFET (Metal Oxide Semiconductor Field Effect Transistor).

Figure 7:
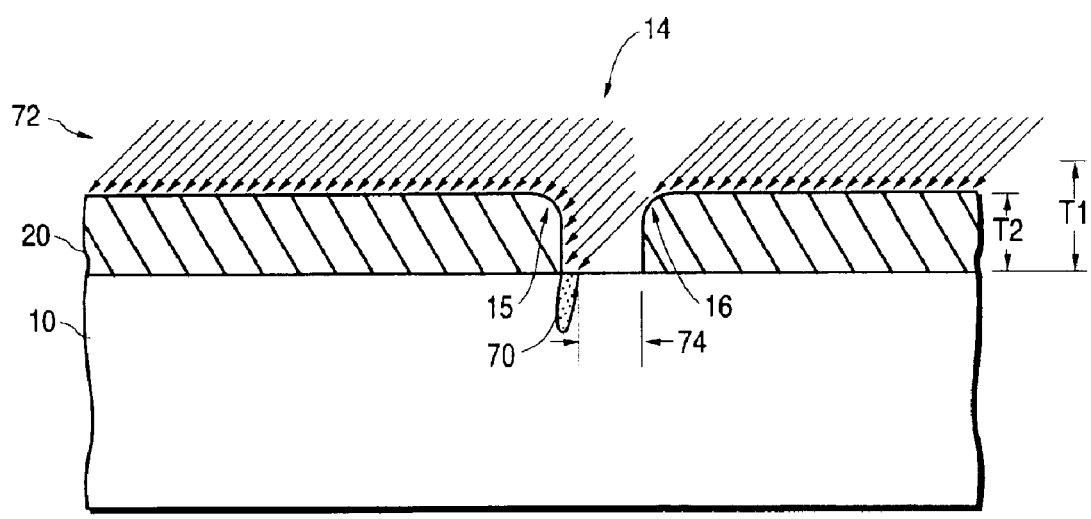
FIG. 7 is a cross-sectional view of the structure of FIG. 3 that illustrates an implant that is performed at an angle of 45 degrees in accordance with one embodiment of the present invention.

FIG. 7 illustrates an exemplary implant region 70 that is formed in accordance with one embodiment of the present invention. In the embodiment shown in FIG. 7, ions 72 are implanted at an angle of 45 degrees with respect to vertical. In this embodiment, some of ions 72 pass through opening 14 and strike semiconductor substrate 10, forming implant region 70. It can be seen that implant region 70 is quite small. However, the shadow region 74 is smaller than the shadow region that a prior art masking structure having thickness T1 would have. Furthermore, implant region 70 could not be formed using a prior art masking structure having a thickness T1 because the ions 72 would be completely blocked by the prior art masking structure.

The method and apparatus of the present invention results in reduction of shadow area. This allows for forming larger implant regions for any given size of opening in the masking layer. Accordingly, the present invention allows for reduced device size and increases device layout flexibility.

The preferred embodiment of the present invention is thus described. While the present invention has been described in particular embodiments, it should be appreciated that the present invention should not be construed as limited by such embodiments, but rather construed according to the following claims.

What is claimed is:

1. A method for forming a photoresist structure comprising:

forming a layer of photoresist over a semiconductor substrate, said layer of photoresist having a designated wavelength, a first thickness and high optical absorption of light having a first wavelength;

exposing said layer of photoresist to said light having a first wavelength;

exposing portions of said layer of photoresist to light having a second wavelength so as to pattern said layer of photoresist, said second wavelength approximately said designated wavelength; and developing said layer of photoresist, after said exposing said layer of photoresist to said light having a first wavelength and said exposing portions of said layer of photoresist to light having a second wavelength, so as to form a photoresist structure having a second thickness that is less than said first thickness.

2. A method for forming a photoresist structure as recited in claim 1 wherein said layer of photoresist has sufficiently high absorption of said light having a first wavelength such that said light having a first wavelength is completely absorbed by said layer of photoresist near a top surface of said layer of photoresist.

3. A method for forming a photoresist structure as recited in claim 2 wherein said layer of photoresist is i-line photoresist and wherein said designated wavelength is approximately 365 nanometers.

4. A method for forming a photoresist structure as recited in claim 3 wherein said light having a first wavelength comprises light having a deep ultraviolet wavelength.

5. A method for forming a photoresist structure comprising:

forming a layer of i-line photoresist having a first thickness over a semiconductor substrate;

exposing said layer of i-line photoresist to deep ultraviolet light;

exposing portions of said layer of i-line photoresist to light having a wavelength of approximately 365 nanometers so as to pattern said layer of i-line photoresist; and developing said layer of i-line photoresist, after said exposing said layer of i-line photoresist to deep ultraviolet light and said exposing portions of said layer of i-line photoresist to light having a wavelength of approximately 365 nanometers, so as to form a photoresist structure having a second thickness that is less than said first thickness.

6. A method for forming a photoresist structure as recited in claim 5 wherein said deep ultraviolet light has a wavelength of approximately 248 nanometers.

7. A method for forming a photoresist structure as recited in claim 5 wherein said deep ultraviolet light has a wavelength of approximately 193 nanometers.

8. A method for forming a photoresist structure as recited in claim 5 wherein said exposing said layer of i-line photoresist to deep ultraviolet light comprises exposing the entire top surface of said layer of i-line photoresist to deep ultraviolet light.

9. A method for forming an implant region comprising:

forming a layer of photoresist over a semiconductor substrate, said layer of photoresist having a designated wavelength, a first thickness and high optical absorption of light having a first wavelength;

exposing said layer of photoresist to said light having a first wavelength;

exposing portions of said layer of photoresist to light having a second wavelength so as to pattern said layer of photoresist, said second wavelength approximately said designated wavelength;

developing said layer of photoresist, after said exposing said layer of photoresist to said light having a first wavelength and said exposing portions of said layer of photoresist to light having a second wavelength, so as to form a photoresist structure having an opening extending therethrough and having a second thickness that is less than said first thickness; and implanting ions at an angle that is not orthogonal to a top surface of said semiconductor substrate, said ions passing through said opening so as to form an implant region.

10. A method for forming an implant region as recited in claim 9 wherein said light having a first wavelength comprises deep ultraviolet light.

11. A method for forming an implant region as recited in claim 10 wherein said layer of photoresist comprises i-line photoresist and wherein said light having a second wavelength comprises light having a wavelength of approximately 365 nanometers.

12. A method for forming an implant region as recited in claim 10 wherein said first exposure further comprises illuminating said layer of photoresist using a deep ultraviolet scanner.

13. A method for forming an implant region as recited in claim 10 wherein said first exposure comprises exposing the entire top surface of said semiconductor substrate to light having a wavelength of 248 nanometers.

14. A method for forming an implant region as recited in claim 10 wherein said deep ultraviolet light has a wavelength of approximately 157 nanometers.

* * * * *